United States Patent
Boemler

(10) Patent No.: US 7,447,085 B2
(45) Date of Patent: Nov. 4, 2008

(54) MULTILEVEL DRIVER

(75) Inventor: Christian M. Boemler, Lake Oswego, OR (US)

(73) Assignee: Micron Technology, Inc., Boise, ID (US)

( * ) Notice: Subject to any disclaimer, the term of this patent is extended or adjusted under 35 U.S.C. 154(b) by 252 days.

(21) Appl. No.: 11/504,433

(22) Filed: Aug. 15, 2006
(Under 37 CFR 1.47)

(65) Prior Publication Data

US 2008/0043540 A1  Feb. 21, 2008

(51) Int. Cl.
*G11C 7/00* (2006.01)
(52) U.S. Cl. ............... 365/189.11; 365/189.09; 365/230.06; 365/228; 365/229
(58) Field of Classification Search ............ 365/189.11, 365/189.09, 230.06, 228, 229
See application file for complete search history.

(56) References Cited

U.S. PATENT DOCUMENTS

| | | | |
|---|---|---|---|
| 5,157,281 A | 10/1992 | Santin et al. | |
| 5,668,758 A | 9/1997 | Yiu et al. | |
| 6,181,606 B1 * | 1/2001 | Choi et al. | ............. 365/185.23 |
| 6,285,608 B1 * | 9/2001 | Roohparvar | ................ 365/201 |
| 6,400,638 B1 | 6/2002 | Yamada et al. | |
| 6,487,687 B1 | 11/2002 | Blake et al. | |
| 6,731,273 B2 | 5/2004 | Koyama et al. | |
| 6,768,688 B2 | 7/2004 | Mihara | |
| 6,809,986 B2 | 10/2004 | Kim et al. | |
| 6,847,070 B2 | 1/2005 | Fox | |
| 6,937,278 B2 | 8/2005 | Huang et al. | |
| 6,985,399 B2 | 1/2006 | Lee | |
| 7,009,885 B2 | 3/2006 | Pekny | |
| 7,015,448 B2 | 3/2006 | Barna | |
| 7,027,351 B2 | 4/2006 | Lee et al. | |
| 2006/0065814 A1 | 3/2006 | Altice, Jr. et al. | |
| 2006/0077745 A1 | 4/2006 | Kitazaki et al. | |

* cited by examiner

*Primary Examiner*—Pho M. Luu
(74) *Attorney, Agent, or Firm*—Brooks, Cameron & Huebsch, PLLC

(57) ABSTRACT

The present disclosure includes various method, device, and system embodiments for multilevel driving of rowlines and/or wordlines. One such method embodiment includes supplying a first power voltage (V1) and a second power voltage (V2) that is greater than V1, to the driver circuit. The method includes supplying a first boost voltage (V3), V3 being greater than V2, and a reference voltage (Vref) that is less than V1, to the driver circuit. The method includes coupling a level shifter to the driver circuit, the level shifter including a number of input signals configured to control a drive output of the driver circuit in order to switch the drive output successively from a voltage at or below Vref to at least one of V1, V2, and Vref prior to switching the driving output to V3.

40 Claims, 9 Drawing Sheets

MULTILEVEL DRIVER

TECHNICAL FIELD

The present disclosure relates generally to semiconductor devices and, more particularly, to memory and/or imaging devices having multilevel driver circuits.

BACKGROUND

Memory devices and/or imaging devices can be provided as internal, semiconductor, integrated circuits in computers or other electronic devices, e.g., cameras, or cell phones, among various other devices. There are many different types of memory including random-access memory (RAM), read only memory (ROM), dynamic random access memory (DRAM), synchronous dynamic random access memory (SDRAM), and flash memory, among others. There are also many different types of imagers including charge coupled device (CCD) imagers and complimentary metal oxide semiconductor (CMOS) imagers, among other imagers and/or image sensors.

Many memory devices include an array of memory cells arranged in rows and columns, while many imaging devices include an array of pixels arranged in rows and columns. Driver circuitry, e.g., a row/wordline driver, can be used to drive a row of pixels or a wordline to various voltages to perform various functions.

For example, in a flash memory device, a wordline driver can be used to apply various positive and negative voltages to wordlines in order to read, erase, refresh, and/or write data into the memory cell array. A row driver can be used to drive a row select signal or a row reset signal to various voltage levels in order to select the pixels in a row or to reset the pixels in a row, for example.

The various voltage levels to which a row/wordline driver output can be driven can be provided by various available voltage sources including external power supplies and/or internal voltage sources, among other voltage sources. The internal sources may include boost circuits that can provide positive and/or negative boost voltages to a driver. Boost circuits may be capacitively coupled which may cause boost voltages to be charge sensitive. As such, switching from a first voltage to a boosted voltage can put strain on a booster circuit in the form of charge depletion and/or current surge noise due to the presence of capacitive coupling.

Current row/wordline driver implementations can include level shifters that can be used to switch the driver output between two voltage levels. In such implementations, a multiplexer can be used to switch the driver output signal outside of the array to drive the output signal from an external power supply voltage to a boosted voltage.

However, switching outside the array can put strain on booster circuits since the booster circuit may drive a highly capacitive power wire that may go across all rows, level shifters for all rows, and a driver output signal for a row to receive the boost voltage. One such driver implementation is described in U.S. Pat. No. 5,668,758 entitled "Decode Wordline Driver with Positive and Negative Voltage Modes" to Yiu et al., which describes a wordline driver for a flash memory array.

Therefore, many row/wordline drivers may not provide drive outputs in a manner that adequately and/or efficiently switches between available voltage sources.

DETAILED DESCRIPTION

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
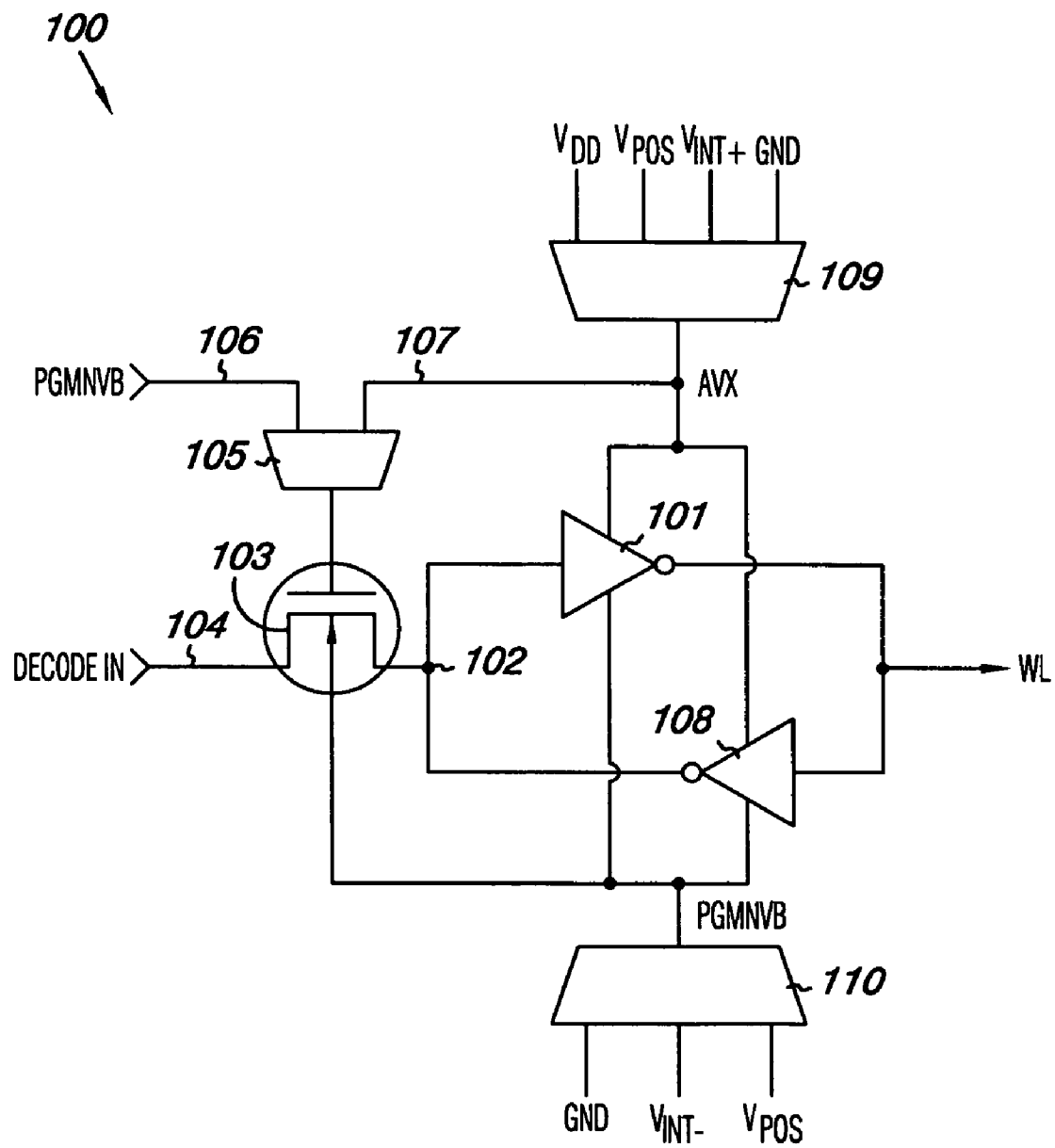
FIG. 1 illustrates a schematic diagram of a wordline driver according to the prior art.

FIG. 1 illustrates a schematic diagram of a wordline driver 100 according to the prior art. This wordline driver includes supply voltages AVX and PGMNVB supplied through selector circuitry 109 and 110, respectively. Selector circuitry 109 selects from among a positive supply voltage VDD, a high positive voltage VPOS, an intermediate positive voltage VINT+, and ground GND. Selector circuitry 110 selects from among a negative potential VNEG, an intermediate negative potential VINT−, and ground GND.

The wordline driver 100 of FIG. 1 includes an inverter 101 that operates to select either the value AVX for connection to the wordline WL, or the value PGMNVB for connection to the WL depending on the value of the wordline select signal from the decoder (DECODE IN) on line 104. The inverter 101 has its output connected to the wordline WL and to an inverter 108.

The wordline driver 100 of FIG. 1 also includes a selector 105 that supplies either the signal PGMNVB on line 106 or the signal AVX on line 107 to the gate of transistor 103, e.g., an n-channel metal oxide semiconductor (NMOS) transistor.

The selectors (e.g., multiplexers) 105, 109, and 10 are operated to establish a program mode, a read mode, and an erase mode associated with a flash memory device.

Figure 2A:
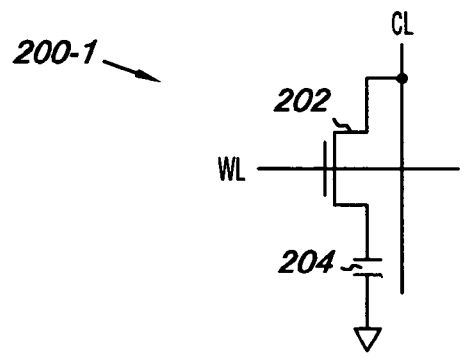
FIG. 2A illustrates a schematic diagram of a portion of a one transistor (1T) DRAM cell array.
Figure 2B:
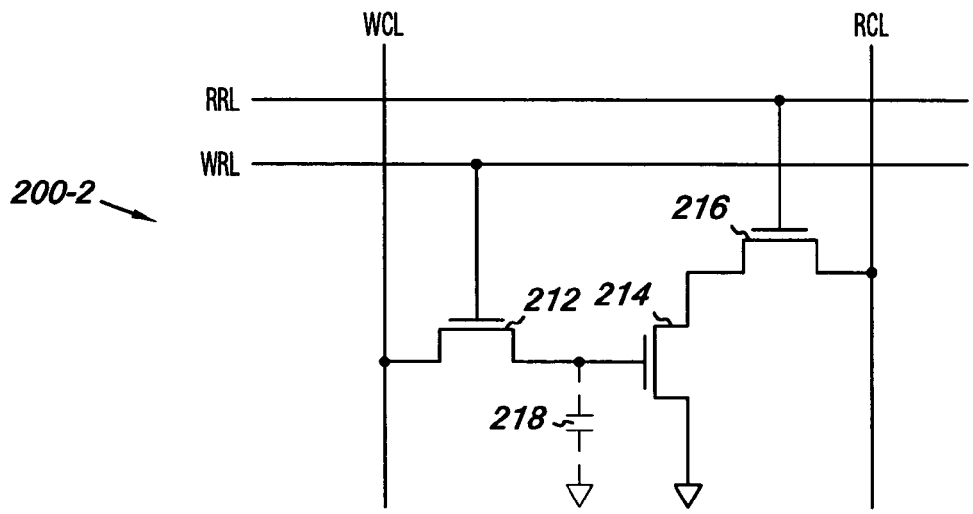
FIG. 2B illustrates a schematic diagram of a portion of a three transistor (3T) DRAM cell array.
Figure 2C:
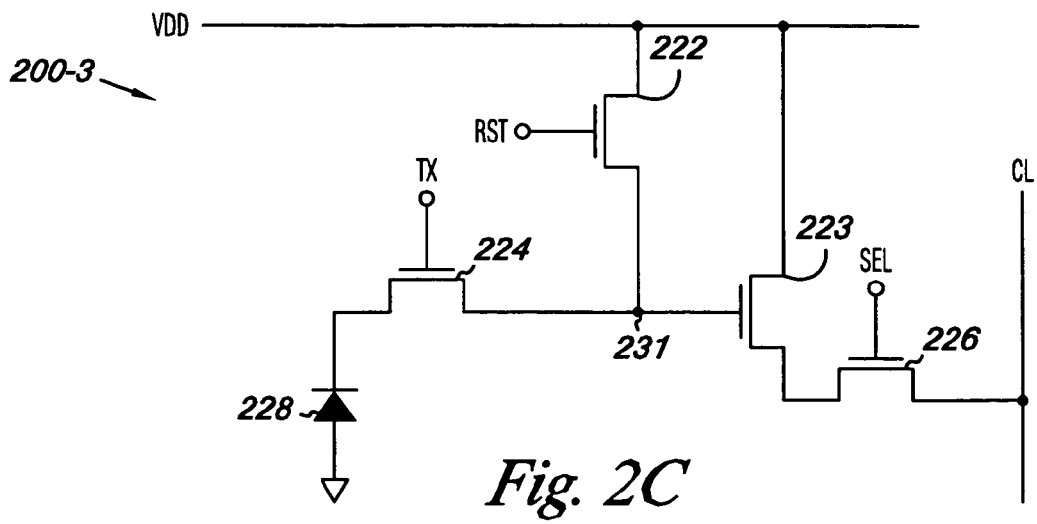
FIG. 2C illustrates a schematic diagram of a portion of a four transistor (4T) pixel array.

FIGS. 2A-2C illustrate schematic diagrams of portions of memory cell and/or pixel cell arrays which include wordlines/rowlines that can be driven by drive outputs of various multilevel driver embodiments of the present disclosure. Embodiments are not limited to these examples. For instance, various multilevel driver embodiments of the present disclosure can be used to drive the row/wordlines of various other memory cell and/or pixel cell arrays, e.g., flash memory arrays, 3T pixel arrays, 5T pixel arrays, SRAM arrays, among other arrays.

FIG. 2A illustrates a schematic diagram of a portion of a one transistor (1T) DRAM cell array. The 1T DRAM cell 200-1 of FIG. 2A includes an NMOS transistor 202 connected in series by its source to a capacitor 204. A 1T DRAM cell may also be referred to as a one transistor one capacitor (1T1C) cell.

The drain of transistor 202 is connected to a column line (CL) and its gate is connected to a wordline (WL). As used herein, a wordline may also be referred to as a rowline, and a column line may also be referred to as a digitline and/or a bitline. In operation, the cell 200-1 can be written to by driving the wordline to a logic high voltage level, turning ON transistor 202, and allowing the columnline to charge or discharge the capacitor 204.

FIG. 2B illustrates a schematic diagram of a portion of a three transistor (3T) DRAM cell array. The 3T DRAM cell 200-2 includes an NMOS write transistor 212, an NMOS read transistor 216 connected in series to an NMOS transistor 214, and an input capacitance 218 of transistor 214.

Unlike in a 1T DRAM cell, which includes a single wordline and a single columnline, a 3T DRAM cell includes rowlines and columnlines that are separated into read and write line pairs for reading and writing operations. As shown in FIG. 2B, the write transistor 212 has its drain connected to a write columnline (WCL) and its gate connected to a write rowline (WRL). Also, the read transistor 216 has its drain connected to a read columnline (RCL) and its gate connected to a read rowline (RRL).

In a write operation, the write rowline WRL is driven to a logic high voltage, which turns write transistor 2120N such that data on the write columnline WCL is passed to the gate of transistor 214, which charges or discharges the input capacitance 218. The write rowline WRL can then be driven to a logic low to turn OFF transistor 212 and complete the write operation.

To read the data of the memory cell 200-2, the read columnline RCL can be charged to a known voltage and then the read rowline RRL can be driven to a logic level high voltage. The logic high on the read rowline RRL turns ON transistor 216 and allows transistor 214 either to pull the read columnline RCL low or to not change the precharged voltage of the read columnline RCL. That is, if transistor 214 is OFF, the state of the read columnline RCL is not affected.

FIG. 2C illustrates a schematic diagram of a portion of a four transistor (4T) pixel array. As shown in FIG. 2C, pixel cell 200-3 includes a photodiode 228, a reset transistor 222, a source follower transistor 223, a transfer transistor 224, a row select transistor 226, and a floating diffusion node 231.

In operation, the various elements of pixel cell 200-3 can perform the functions of: photon to charge conversion by photodiode 228; transfer of charge to the floating diffusion node 231 by the transfer transistor 224; resetting the floating diffusion node to a known state before the transfer of charge to it by reset transistor 222; selection of a pixel cell for readout by row select transistor 226; and output and amplification of a signal representing a reset voltage and a pixel signal voltage based on the photo converted charges by source follower transistor 223, which has its gate connected to the floating diffusion node 231.

A driver output signal voltage of the various multilevel driver embodiments of the present disclosure can be provided to the gate of one or more of transistors 222, 224, and 226 to perform various operations, e.g., row select and/or reset, among other operations. For instance, a multilevel driver output signal voltage can be applied to a pixel select input (SEL), shared by the pixels in a row, in order to select a row of pixels in a pixel cell array. Also, the driver output voltage can be applied to a reset input (RST), shared by the pixels in a row, in order to reset the row of pixels.

In various cases, the RST input and/or the SEL input is driven by a driver to a power supply voltage VDD which may be about 2.8V or to a boost voltage (Vboost) which can be about 3.6V. The RST and/or SEL input can also be driven from the positive boost voltage, e.g., 3.6V, to a negative boost voltage (Vlow) of about −0.2V. In various instances, the Vboost and Vlow voltages may be generated internally by a capacitively coupled boost circuit. Such boosted voltages are very sensitive to the charge being drained off as it makes the boost circuit harder to design and occupies a larger area. As shown in the prior art of FIG. 1, some driver circuits actually switch/multiplex these signals from outside the array area, in which case the power wires going across rows are not static and can involve charge loss due to capacitive coupling.

For example, current row driver implementations have a level shifter per row that only allows switching between two voltage levels. In such implementations, there is a multiplexer outside the array area that switches between Vboost and VDD. During a rising edge of the row signal, the switch is set to VDD and when the row driver signal has settled to VDD, the signal is switched to Vboost to force the row signal from VDD to Vboost. Unfortunately, when the multiplexer switches from VDD to Vboost, the booster circuit has to drive both the highly capacitive power wire that goes across all rows, plus all level shifters in all rows and the row wire that is currently high. This switching puts unnecessary strain on boost circuits compared to various embodiments of the present disclosure.

Figure 3:
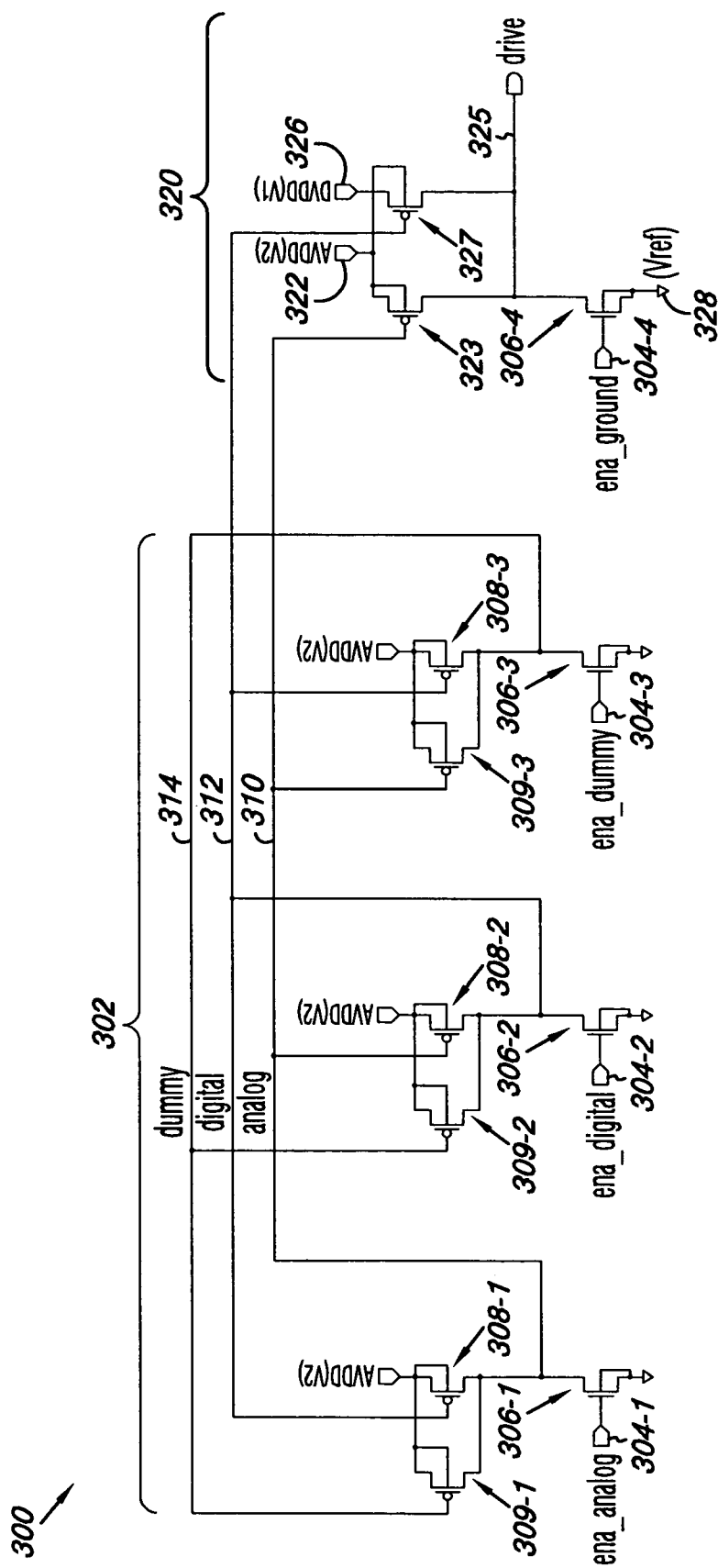
FIG. 3 illustrates a schematic diagram of a multilevel driver according to an embodiment of the present disclosure.
Figure 4:
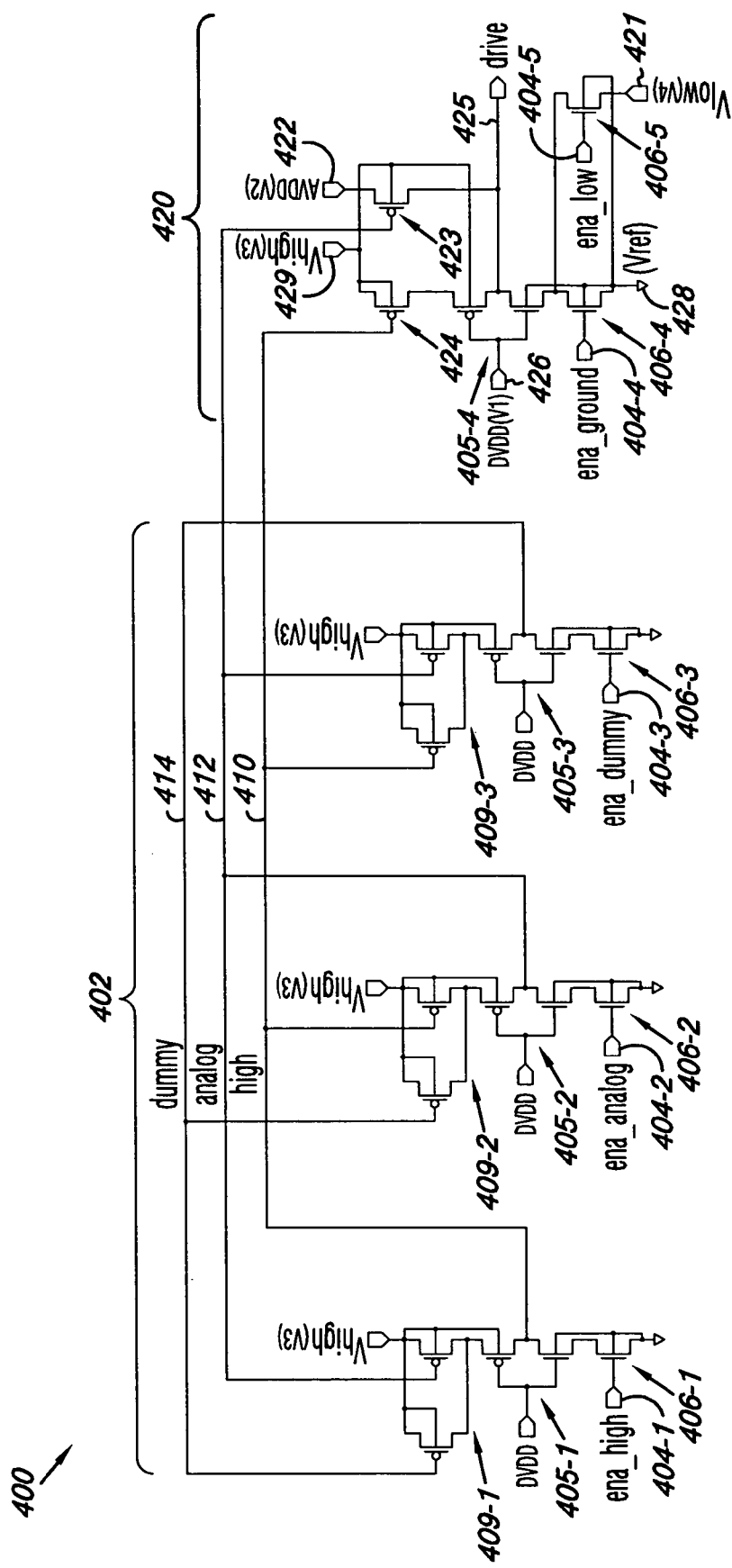
FIG. 4 illustrates a schematic diagram of a multilevel driver according to an embodiment of the present disclosure.

In FIGS. 3-5 schematic diagrams for various multilevel driver embodiments, according to the present disclosure, are provided. The multilevel drivers described herein involve a mixture between an asynchronous set-reset flip flop (SRFF) and a level shifter that only allows one control signal line to be low at any time. The SRFF can level shift enable input signals from a low logic level to a high logic level. Hence, as will be apparent from the described embodiments, a row driver is provided that steps through the different increasing supplies in succession during a rising edge and ameliorates the issues involved with a row driver that only switches between a high and a low voltage.

A multilevel driver can have a number of voltage supply sources coupled thereto. The voltage supplies can exhibit various current noise tolerances and/or various charge sensitivities. In various embodiments, the voltage supply sources can include one or more externally supplied power sources. In such embodiments, the externally supplied power voltages can include a digital voltage power supply (e.g., a power supply which may be predominantly used for digital circuitry) and/or an analog voltage power supply (e.g., a power supply which may be used predominantly for analog circuitry). The analog power supply voltage may be greater than the digital power supply voltage. In such embodiments, it can be beneficial to use a lower voltage supply for digital circuitry that may have a high noise margin and to use a greater voltage supply source for analog circuitry that may have less switching noise and/or a higher sensitivity to noise.

In various embodiments described herein, multilevel drivers can include an externally supplied digital power voltage source of 1.8V and an externally supplied analog power voltage source of 2.8V. However, embodiments of the present disclosure are not limited to any number of externally supplied power voltage sources and/or to these example voltage source levels. In connection with FIGS. 3-5, a multilevel driver can also include a number of boost voltage sources that can be supplied by one or more booster circuits. The booster circuits can be capacitively coupled boost circuits which can produce boosted voltages that may be sensitive to charge drain. Boost voltages can be positive and/or negative voltages and can be greater than or less than the externally and/or internally supplied power voltage sources. For example, a multilevel driver can include a positive boost voltage that is greater than one or more power supply voltages and a negative boost voltage that is less than a reference voltage source (e.g., ground).

In the embodiment shown in FIG. 3, the multilevel driver 300 includes a level shifter portion 302 and a driver portion 320. As shown in the embodiment of FIG. 3, the level shifter 302 is integral to the multilevel driver 300. In the embodiment illustrated in FIG. 3, the multilevel driver 300 is coupled to a first supplied voltage source 326, a second supplied voltage source 322, and a ground potential 328. The first and second supplied voltage sources 326 and 322 can be supplied internally or externally to the driver 300. The voltage sources 326, 322, and 328 can also be referred to herein as V1, V2, and Vref, respectively. The voltage sources 322, 326, and 328 can be coupled to the drive output 325 of the multilevel driver through respective transistors 323, 327, and 306-4. That is, V2 322 (e.g., analog VDD) can be applied to the drive output when transistor 323 is ON, V1 326 (e.g., digital VDD) can be applied to the drive output when transistor 327 is ON, and Vref 328 (e.g., ground) can be applied to the drive output when transistor 306-4 is ON.

As described further herein, multilevel drivers according to various embodiments of the present disclosure are not limited to the number of levels (e.g., to the number of supplied voltages) to which the drive output can be driven. That is, although the multilevel driver 300 includes three drive voltage levels V1 326, V2 322, and Vref 328, various multilevel driver embodiments can include four or more drive voltage levels.

A number of control signal lines can couple the level shifter portion 302 of a multilevel driver to the driver portion 320 of a multilevel driver 300. For example, in the embodiment shown in FIG. 3, control signal lines 310 and 312 couple the level shifter portion 302 to the drive portion 320 of multilevel driver 300. In various embodiments, the control signal lines 310 and 312 can be coupled to the gates of transistors which have a source/drain coupled to a supply voltage source (e.g., various internally and/or externally supplied power voltage sources and/or boost voltage sources, among other supply voltage sources).

For example, in the embodiment shown in FIG. 3, the control signal lines 310 and 312 are coupled to the gates of transistors 323 and 327, respectively. In this embodiment, transistors 323 and 327 are PMOS transistors such that they are ON when the respective control signal lines 310 and 312 are low (e.g., at a ground potential). In this manner, the voltage source 322 can be applied to the drive output 325 when control signal line 310 is low and the voltage source 326 can be applied to the drive output when control signal line 312 is low.

The multilevel driver provides logic circuitry including a number of enable input signals which are operable to successively couple various supply voltages to the driver output. For example, in the embodiment of FIG. 3, the multilevel driver 300 includes enable inputs 304-1 (ena_analog), 304-2 (ena_digital), 304-3 (ena_dummy), and 304-4 (ena_ground). As shown in FIG. 3, the inputs 304-1, 304-2, 304-3, and 304-4 can be coupled to the gates of respective transistors 306-1, 306-2, 306-3, and 306-4. In this embodiment, the transistors 306-1, 306-2, 306-3, and 306-4 are NMOS transistors that can be turned ON by a logic high level (e.g., 1.8V, 3.3V, or 10V, among various other logic high levels) applied to their respective gates, with their drain regions coupled to ground.

The enable inputs of the level shifter portion 302 of the multilevel driver 300 can have a corresponding control signal line. For example, in the embodiment illustrated in FIG. 3, enable input 304-1 (ena_analog) has a corresponding control signal line 310 (analog), enable input 304-2 (ena_digital) has a corresponding control signal line 312 (digital), and enable input 304-3 (ena_dummy) has a corresponding control signal line 314 (dummy). In various embodiments, and as described below, a logic level high signal applied to a particular enable input can cause a logic level low, e.g., ground, to be applied to the corresponding control signal line and can cause a logic level high to be applied to the remaining control signal lines.

In other words, according to various embodiments, the level shifter circuitry can be configured such that only one of the control signal lines can be low at a time. In various embodiments, the sources of the transistors coupled to the enable inputs of the level shifter portion 302 can also be connected to the drains of associated transistors whose gates are coupled to control signal lines. For example, in the embodiment illustrated in FIG. 3, the sources of transistors 306-1, 306-2, and 306-3 are each coupled to a control signal line 310, 312, and 314, respectively. Also, the sources of transistors 306-1, 306-2, and 306-3 are each coupled to the drains of an associated pair of p-channel metal oxide semiconductor (PMOS) transistors 308-1/309-1, 308-2/309-2, and 308-3/309-3, respectively.

In various embodiments, the pair of transistors associated with an enable input can be coupled to, the non-corresponding control signal lines, one each respectively. For instance, in the embodiment of FIG. 3, the transistors associated with the ena_analog input 304-1 (e.g., transistors 308-1 and 309-1) are coupled to control signal lines 312 (digital) and 314 (dummy), respectively. Similarly, the pair of transistors 308-2 and 309-2 associated with ena_digital 304-2, are respectively coupled to control signal lines 310 (analog) and 314 (dummy), and the pair of transistors 308-3 and 309-3 associated with ena_dummy 304-3 are respectively coupled to control signal lines 310 (analog) and 312 (digital). Configuration of the multilevel driver 300 this manner allows the enable input signals to operably couple the various supply voltage sources to the drive output in a successive manner. For example, the enable inputs 304-1 to 304-4 can be controlled to transition the drive output 325 to the second supplied voltage source 322 (V2), e.g., a second externally supplied voltage source, from the ground potential 328 (Vref), through the first supplied voltage source 326 (V1), e.g., a first externally supplied voltage source.

In one embodiment of operation, the ground potential 328 (Vref) can initially be provided to the drive output 325 by applying a logic high level from the enable input 304-4 (ena_ground) to NMOS transistor 306-4 while a logic low is applied from enable inputs 304-1 (ena_analog) and 304-2 (ena_digital) to respective NMOS transistors 306-1 and 306-2, while and a logic high is applied from enable input 304-3 (ena_dummy) to NMOS transistor 306-3. As the reader will appreciate, a logic high level applied to transistor 306-4 turns it ON such that the ground potential is applied to the drive output 325. Also, a logic high applied to 306-3 turns it ON which in turn applies a logic low level (e.g., ground) to PMOS transistors 309-1 and 309-2 via control signal line 314, turning them ON. Turning ON transistors 309-1 and 309-2 causes a logic high level, e.g., AVDD (V2) 322 in this example, to be applied to control signal lines 310 and 312 such that PMOS transistors 323 and 327 are OFF.

In this example operational embodiment, the drive output 325 can be next brought from the ground potential (Vref) to a next highest available supply voltage (V1), e.g., a digital supply voltage source 326 (DVDD) of about 1.8V. To apply the supply voltage (V1) 326 to the drive output 325, the ena_digital input 304-2 is sent high, turning on transistor 306-2, which couples a logic low level (e.g., a ground potential in this example since the drain of transistor 306-2 is coupled to ground) to the gates of PMOS transistors 308-1, 308-3, and 327 via control signs line 312. Turning ON transistors 308-1 and 308-3 drives the control signal lines 310 and 314 to a logic high, e.g., AVDD (V2) 322 as the sources of transistors 308-1 and 308-3 are coupled to AVDD, and turning ON transistor 327 drives the output 325 to the supply voltage source level 326 (V1). A logic low is applied from enable input 304-4 (ena_ground) to transistor 306-4 such that transistor 306-4 is OFF.

Continuing in this example, the drive output 325 can next be brought from the power supply voltage 326 (V1) to a next highest available supply voltage (V2), e.g., an analog supply voltage source 322 of about 2.8V. To apply the supply voltage (V2) 322 to the drive output 325, the ena_analog input 304-1 is sent high, turning on transistor 306-1 and applying a logic low level (e.g., a ground potential) to the gates of PMOS transistors 308-2, 308-3, and 323 via control signal line 310. Turning ON transistors 308-2 and 308-3 drives the control signal lines 312 and 314 to a logic high, e.g., AVDD (V2) 322, and turning ON transistor 323 drives the output 325 to the supply voltage source level (V2) 322. The enable input 304-4 (ena_ground) is held low such that transistor 306-4 remains OFF.

In such operation embodiments, the multilevel driver 300 drive output 325 can be successively applied to one or more wordlines and/or rowlines of various memory cell and/or pixel cell arrays. For example, the drive output 325 of multilevel driver 300 can be applied to one or more write rowlines of a three transistor (3T) dynamic random access memory (DRAM) array in order to successively increase a write transistor from a first supply voltage level (e.g., a first externally supplied voltage DVDD) to a second voltage supply level (e.g., a second externally supplied voltage AVDD) during bit writing.

FIG. 4 illustrates a schematic diagram of a multilevel driver 400 according to an embodiment of the present disclosure. In the embodiment shown in FIG. 4, the multilevel driver 400 includes an integral level shifter portion 402 and a driver portion 420. FIG. 4 illustrates an embodiment with similar operation to that described in connection with FIG. 3, but useful for implementation with a quad-level shifter.

In the embodiment illustrated in FIG. 4, the multilevel driver 400 is coupled to a first supplied voltage source 426 (V1), e.g., DVDD, a second supplied voltage source 422 (V2), e.g., AVDD, a first boost voltage source 429 (V3), e.g., Vhigh, a second boost voltage source 421 (V4), e.g., Vlow, and a reference potential 428 (Vref), e.g., ground. In various embodiments, the first supplied voltage source 426 and/or the second supplied voltage source can be external and/or internal supply voltage sources.

In the embodiment shown in FIG. 4, the voltage sources 422 (V2), 429 (V3), 421 (V4), and 428 (Vref) can be coupled to the drive output 425 of the multilevel driver 400 through respective transistors 423, 424, 406-5, and 406-4. That is, voltage 429 (V3) can be applied to the drive output when transistor 424 is ON, voltage 422 (V2) can be applied to the drive output when transistor 423 is ON, voltage 421 (V4) can be applied to the drive output when transistor 406-5 is ON, and voltage 428 (Vref) can be applied to the drive output when transistor 406-4 is ON.

In the embodiment shown in FIG. 4, the voltage source 426 (V1), e.g., DVDD, can supply power to a number of cascode structures 405-1, 405-2, 405-3, and 405-4. As shown in FIG. 4, the cascode structures 405-1 to 405-4 include a PMOS and NMOS transistor coupled in series with their gates receiving the voltage source 426 (V1), e.g., DVDD. The cascode structures 405-1 to 405-4 can be used to reduce and/or prevent the voltage applied to the sources/drains of the various transistors from exceeding a certain value which can reduce and/or prevent damage to the transistors.

In the embodiment shown in FIG. 4, the voltage source 426 (V1), e.g., DVDD, powers the cascode structures 405-1 to 405-4 but is not used as a drive level output 425. That is, although the multilevel driver 400 includes five supply sources 426 (V1), 422 (V2), 429 (V3), 421 (V4) and 428 (Vref), the driver circuitry is configured such that the driver is a four level driver, i.e., the output 425 can be driven to four voltage levels (V2, V3, V4, and Vref). However, as described below in connection with the embodiments of FIGS. 5A and 5B, in various embodiments, a voltage source 426 (V1), e.g., DVDD, can be applied to the cascode structure and can be applied to the driver output to provide a five level driver.

In the embodiment shown in FIG. 4, the level shifter portion 402 is coupled to the drive portion 420 of multilevel driver 400 by control signal lines 410 (high) and 412 (analog), which are connected to the gates of respective transistors 424 and 423. In this embodiment, transistors 424 and 423 are PMOS transistors such that they are ON when the respective control signal lines 410 and 412 are low (e.g., at a ground potential). In this manner, the voltage source 422 (V2), e.g., AVDD, can be applied to the drive output 425 when control signal 412 is low and the voltage source 429 (V3), e.g., Vhigh can be applied to the drive output when control signal line 410 is low.

As shown in the embodiment of FIG. 4, multilevel driver 400 includes logic circuitry including a number of enable input signals operable to successively apply various supply voltages to the driver output. The multilevel driver 400 includes enable inputs 404-1 (ena_high), 404-2 (ena_analog), 404-3 (ena_dummy), 404-4 (ena_ground), and 404-5 (ena_low). Each of the enable inputs 404-1, 404-2, and 404-3 (e.g., ena_high, ena_analog, and ena_dummy) of the level shifter portion 402 is associated with a corresponding control signal line (e.g., high 410, analog 412, and dummy 414, respectively). The enable inputs 404-1, 404-2, 404-3, 404-4 and 404-5 are coupled to the gates of respective transistors 406-1, 406-2, 406-3, 406-4 and 406-5. In this embodiment, the transistors 406-1, 406-2, 406-3, 406-4 and 406-5 are NMOS transistors that can be turned ON by a logic high level (e.g., 1.8V, 3.3V, or 10V, among various other logic high levels based on the transistor design) applied to their respective gates. As described above in connection with FIG. 3, the enable inputs can each have an associated pair of transistors having their gates coupled the non-corresponding control signal lines.

In the embodiment illustrated in FIG. 4, the sources of transistors 406-1, 406-2, and 406-3 are each coupled to a respective control signal line 410 (high), 412 (analog), and 414 (dummy), through a cascode structure 405-1, 405-2, 405-3, respectively. Also, the sources of transistors 406-1, 406-2, and 406-3 are each coupled to the drains of an associated pair of PMOS transistors (e.g., 409-1, 409-2, and 409-3, respectively) having their sources coupled to a voltage source such as V3, e.g., Vhigh, as shown. The gates of the pair of PMOS transistors associated with each of the enable inputs 404-1, 404-2, and 404-3 (ena_high, ena_analog, and ena_dummy) of the level shifter portion 402 are each coupled to a non-corresponding control signal line. That is, as shown in FIG. 4, one of the pair of transistors 409-1 associated with enable input 404-1 (ena_high) has its gate coupled to the "analog" control signal line 412 and one of the pair 409-1 has its gate coupled to the "dummy" control signal line 414.

Again, configuration of multilevel driver circuitry in this manner can allow the enable input signals to be operable to apply the various supply voltage sources to the drive output in a successive manner. The enable inputs can be controlled such that the drive output signal is successively switched to a positive boost voltage through one or more externally supplied voltage sources on a rising edge of the driver output signal. A rising edge of the driver output signal can refer to an increasing driver output signal level from a lower voltage level (e.g., from a low level such as ground to a higher voltage such as an externally supplied power voltage of about 3V and/or to a boost voltage supplied by a booster circuit).

For example, the multilevel driver embodiment of FIG. 4 can be used to successively switch a rowline/wordline signal of a pixel/memory cell array to V2, e.g., AVDD, and V3, e.g., Vhigh, on a rising edge of the driver output signal 425 (drive). As an example, V2 can be a supplied power voltage source, e.g., an external voltage source AVDD of 2.8V, and V3 can be an internally generated positive boost voltage from a booster circuit, e.g., Vhigh of 3.6V. Embodiments are not limited to this example. In this example, the driver output 425 can initially be at or near a low voltage such as ground, or can be brought to a ground voltage by sending the enable input 404-4 (ena_ground) to a high logic level while sending logic low levels to enable inputs 404-1 (ena_high), 404-2 (ena_analog), and 404-5 (ena_low), as described above in the discussion of FIG. 3. The drive output 425 can be next brought from ground to V2, e.g., AVDD. To apply the supply voltage 422 (V2) to the drive output 425, the ena_analog input 404-2 is sent high, turning on transistor 406-2 and applying a logic low level (e.g., a ground potential) to control signal line 412 which turns PMOS transistor 4230N. The logic low level on control signal line 412 is coupled to one of the pair of PMOS transistors associated with each of the ena_high input 404-1 and the ena_dummy input 404-3 such that a logic high voltage level 429 (V3), e.g., Vhigh in this example, is applied to control signal lines 410 (high) and 414 (dummy). The other enable inputs (ena_high 404-1, ena_dummy 404-3, ena_ground 404-4, and ena_low 404-5) are all logic level low such that voltage source 422 (V2) is the only available voltage source applied to the driver output 425.

Continuing this example, the drive output can be then brought from the power supply voltage 422 (V2), e.g., AVDD, to the positive boost voltage 429 (V3), e.g., Vhigh. To apply voltage source 429 (V3) to the drive output, the ena_high input 404-1 is sent high, which turns on transistor 406-1 and applies a logic low level to control signal line 410 (high). The logic low on the high control signal line 410 turns on PMOS transistor 424, coupling voltage 429 (V3) to the drive output 425. The logic low on the high control signal line 410 also causes voltage 429 (V3), e.g., Vhigh, to be applied to the dummy 414 and analog 412 control signal lines by turning on one of the pair of PMOS transistors associated with each of the ena_analog 404-2 and ena_dummy 404-3 enable inputs.

Successively driving a rowline/wordline of a pixel/memory cell array from a reference voltage (Vref), e.g.,  ground, to a boosted voltage through at least one externally supplied power voltage, using a multilevel driver as described in the above example, can reduce strain on the driver circuitry and/or on booster circuits associated therewith. However, embodiments are not limited to this example. That is, various multilevel driver embodiments of the present disclosure can be used to drive row/wordlines of various memory and/or imaging devices. The enable inputs can also be controlled such that the drive output signal is successively switched from a positive voltage to a negative boost voltage through one or more intermediate voltage levels (e.g., an externally supplied power voltage or ground, among other intermediate voltage levels) on a falling edge of the driver output signal. A falling edge of the driver output signal can refer to a decreasing driver output signal level from a positive voltage level.

Using the example above, the multilevel driver embodiment of FIG. 4 can be used to successively switch a row signal of a pixel array from a positive boosted voltage V3, e.g., Vhigh, to Vref, e.g., ground, and a negative boosted voltage V4, e.g., Vlow, on a falling edge of the driver output signal 425. As an example, voltage 421 (V4), e.g., Vlow, can be an internally generated negative boost voltage from a booster circuit of −0.2V. Embodiments are not limited to this example.

In this example, the driver output 425 can initially be at the positive boost voltage 429 (V3), e.g., Vhigh, or can be brought to V3 as described above by sending the enable input 404-1 (ena_high) to a high logic level while sending logic low levels to enable inputs 404-2 (ena_analog), 404-3 (ena_dummy), 404-4 (ena_ground), and 404-5 (ena_low). The drive output 425 can be next brought from voltage 429 (V3) to the reference voltage 428 (Vref), e.g., ground, in this example. To apply the reference voltage 428 (Vref) to the drive output 425, the ena_ground input 404-4 is sent high, turning on transistor 406-4. The dummy enable input 404-3 (ena_dummy) is also sent high which causes a logic low to be applied to the corresponding dummy control signal line 414. As described above, sending one of the enable inputs (ena_high 404-1, ena_analog 404-2, and ena_dummy 404-3) to a high logic level causes a logic high (voltage 429 (V3), e.g., Vhigh as shown) to be applied to the other control signal lines due to the logic low on the corresponding control line, e.g., 410 (high), 412 (analog), and 414 (dummy), turning ON one of the PMOS transistors associated with each of the other enable inputs. Therefore, in this example, sending the enable input 404-3 (ena_dummy) to a high logic level causes voltage 429, e.g., Vhigh, to be applied to the high control signal line 410 and the analog control signal line 412 such that PMOS transistors 424 and 423 are OFF.

Continuing this example, the drive output 425 can then be brought from the reference voltage 428 (Vref), e.g., ground, to the negative boost voltage 421 (V4), e.g., Vlow. To apply voltage 421 to the drive output 425, the enable input 404-5 (ena_low) is sent high, which turns on transistor 406-5 and couples voltage source 421 (V4), e.g., Vlow, to the drive output 425. The enable inputs ena_high 404-1, ena_analog 404-2, and ena_ground 404-4 are sent or remain at logic low levels and enable input 404-3 (ena_dummy) is sent high resulting in voltage 429 (V3), e.g., Vhigh, being applied to the analog control signal line 412 and the high control signal line 410 such that PMOS transistors 423 and 424 remain OFF as described above.

Using various multilevel driver embodiments of the present disclosure to successively drive a row/wordline from a positive boost voltage (e.g., 3.6V, 5V, 10V) to a ground voltage and then to a negative boost voltage (e.g., −0.2V, −0.5V, −2V) during a falling edge of the driver output signal, can be beneficial. For example, successively driving the output from a positive boost voltage 429 (V3), e.g., Vhigh, to a negative boost voltage 421 (V4), e.g., Vlow, through voltage 428 (Vref), e.g., ground, may put less strain on the positive boost circuit and/or the negative boost circuit than driving the output directly from the positive boost voltage 429 (V3) to the negative boost voltage 421 (V4).

Figure 5A:
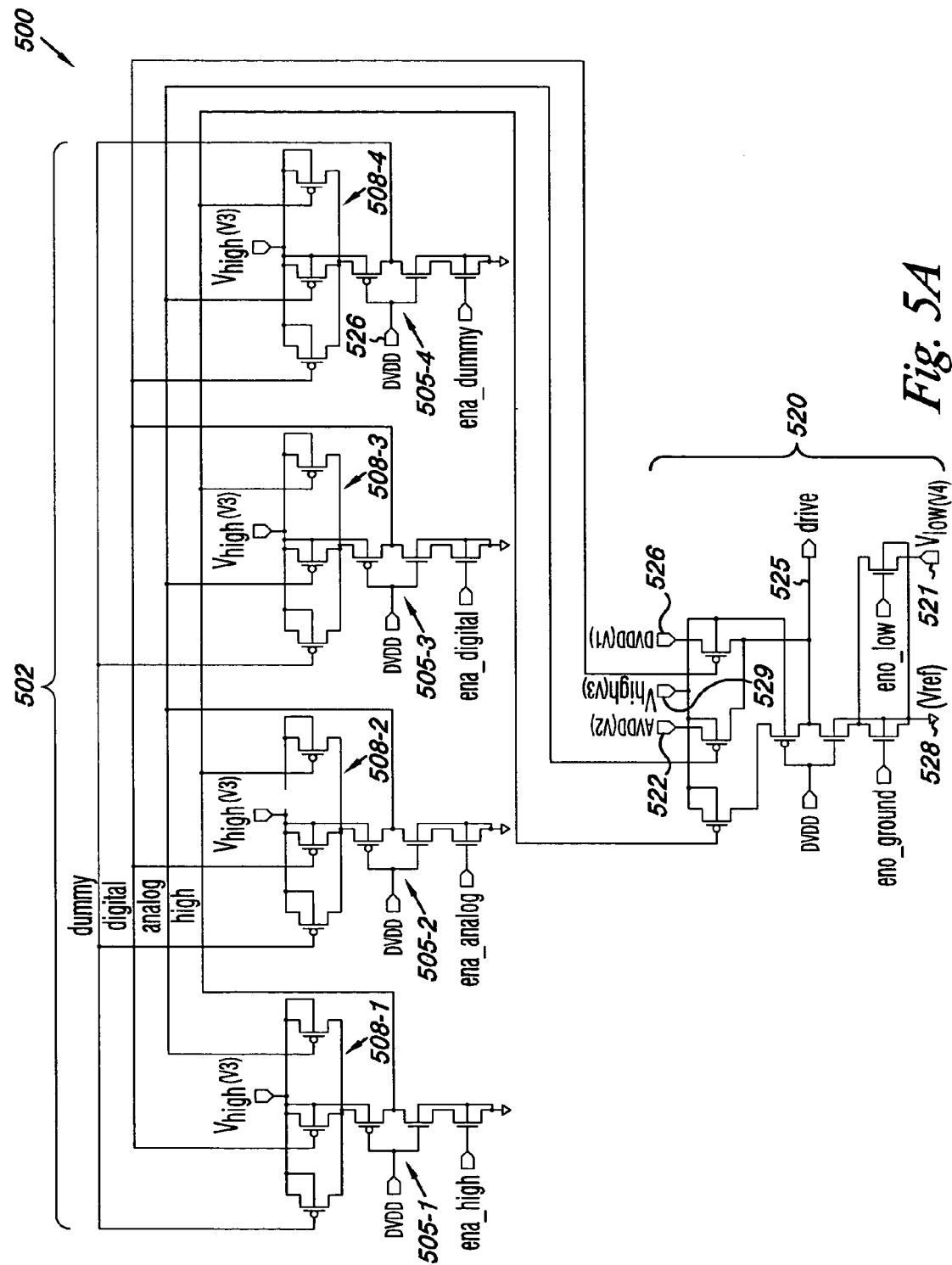
FIG. 5A illustrates a schematic diagram of a multilevel driver according to an embodiment of the present disclosure.
Figure 5B:
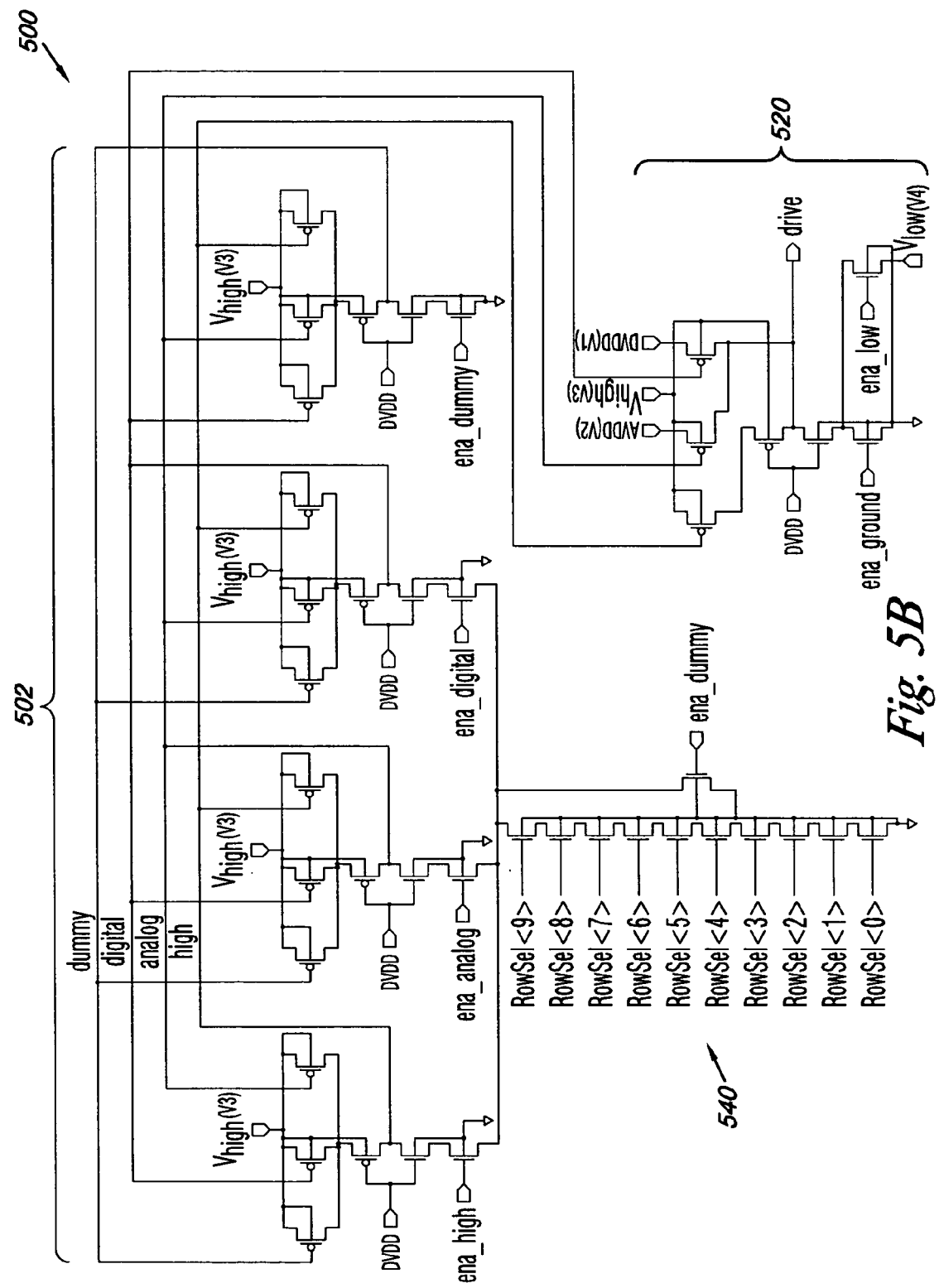
FIG. 5B illustrates the multilevel driver of FIG. 5A including an integrated row decoder according to an embodiment of the present disclosure.

FIGS. 5A and 5B illustrate schematic diagrams of multilevel drivers according to an embodiment of the present disclosure. In the embodiment illustrated in FIGS. 5A and 5B, the multilevel driver 500 is a penta-level driver, i.e., the multilevel driver can apply driver output signals at five voltage levels. As shown in the embodiment of FIGS. 5A and 5B, the multilevel driver 500 includes a level shifter portion 502 and a driver portion 520. That is, in the embodiment of FIG. 5, the level shifter 502 is coupled to the driver portion 520 and is integral to the multilevel driver 500.

In the embodiment shown in FIG. 5A, the multilevel driver 500 is coupled to a number of voltage sources including a first supplied voltage source 526 (V1), e.g., DVDD, a second supplied voltage source 522 (V2), e.g., AVDD, a first boost voltage source 529 (V3), e.g., Vhigh, a second boost voltage source 521 (V4), e.g., Vlow, and a reference voltage 528 (Vref), e.g., ground. As shown in FIG. 5A, the voltage sources of drive portion 520, e.g., 526 (V1), 522 (V2), and 529 (V3), can be coupled to the drive output 525 of the multilevel driver 500 through respective PMOS transistors, and the voltage sources 528 (Vref) and 521 (V4) can be coupled to the drive output 525 through respective NMOS transistors.

In the embodiment shown in FIG. 5A, the voltage source 526 (V1), e.g., DVDD, supplies power to a number of cascode structures 505-1, 505-2, 505-3, and 505-4, as discussed above in connection with FIG. 4. As shown in the embodiment of FIG. 5A, a supply voltage source 526 (V1), e.g., DVDD can be applied to the cascode structures 505-1 to 505-4 and can be applied to the driver output 525 (drive).

In the embodiment shown in FIG. 5A, the level shifter portion 502 includes a number of enable inputs (e.g., ena_high, ena_analog, ena_digital, and ena_dummy) capable of applying a logic level high/low to a respective NMOS transistor to turn it ON/OFF. The level shifter circuitry 502 also includes a number of control signal lines (e.g., high, analog, digital, and dummy) corresponding to each of the enable inputs.

As shown in the embodiment of FIG. 5A, each enable input has an associated set (e.g., a trio in this embodiment) of PMOS transistors to which it is coupled through a cascode structure 505-1 to 505-4. That is, the enable inputs ena_high, ena_analog, ena_digital, and ena_dummy have associated transistor sets 508-1, 508-2, 508-3, and 508-4, respectively. As shown in this embodiment, each of the control signal lines is coupled to each of the transistor sets of the non-corresponding enable input. That is, the "dummy" control signal line is coupled to one transistor from each of transistor sets 508-1, 508-2, and 508-3 (e.g., the transistor sets associated with ena_high, ena_analog, and ena_digital, respectively). The "digital" control signal line is coupled to one transistor from each of transistor sets 508-1, 508-2, and 508-4 (e.g., the transistor sets associated with ena_high, ena_analog, and ena_dummy, respectively). The "analog" control signal line is coupled to one transistor from each of transistor sets 508-1, 508-3, and 508-4 (e.g., the transistor sets associated with ena_high, ena_digital, and ena_dummy, respectively). Similarly, the "high" control signal line is coupled to one transistor from each of transistor sets 508-2, 508-3, and 508-4 (e.g., the transistor sets associated with ena_analog, ena_digital, and ena_dummy, respectively).

In the embodiment illustrated in FIG. 5A, the "high," "analog," and "digital" control signal lines are coupled to the gates of PMOS transistors whose sources are coupled to corresponding voltage sources. That is, the "high" control signal line is coupled to the gate of a transistor whose source is coupled to Vhigh 529 (e.g., a positive booster circuit generating a positive boost voltage). The "analog" control signal line is coupled to the gate of a transistor whose source is connected to voltage source 522 (V2), e.g., an externally supplied analog power voltage source AVDD. The "digital" control signal line is coupled to the gate of a transistor whose source is connected to voltage source 526 (V1), e.g., an externally supplied digital power voltage source DVDD.

As described above, in connection with FIGS. 3 and 4, applying a logic level high to one of the enable inputs (e.g., ena_high, ena_analog, ena_digital, and ena_dummy) turns on the respective NMOS transistor to which it is coupled causing a logic low (e.g., ground in this case) on the corresponding control signal line (e.g., high, analog, digital, and dummy, respectively). As mentioned above, in various embodiments, the level shifter configuration can allow for only one of the control signal lines to have a logic low level at a time. Configuration of multilevel driver circuitry in this manner can allow the enable input signals to be operable to apply the various supply voltage sources to the drive output in a successive manner. In various embodiments, the enable inputs can be controlled such that the drive output signal is successively switched to a positive boost voltage through one or more current noise tolerant and less charge sensitive supplied voltage sources (whether internal or external voltage sources) on a rising edge of the driver output signal.

For example, the multilevel driver embodiment of FIG. 5A can be used to successively switch a row signal of a pixel array (e.g., a 3-transistor or 4-transistor pixel array, among various other pixel arrays) to voltage 522 (V1), e.g., DVDD, voltage 526 (V2), e.g., AVDD, and voltage 529 (V3), e.g., Vhigh, on a rising edge of the driver output signal 525. As described above in connection with the embodiment of FIG. 4, the multilevel driver embodiment of FIG. 5A can also successively switch the driver output 525 from a positive boost voltage 529 (V3), e.g., Vhigh, to a negative boost voltage 521 (V4), e.g., Vlow, through one or more supply voltages (e.g., one or more analog and/or digital external and/or internal supply voltages) and/or through a reference voltage 528 (Vref), e.g., ground.

As an example, voltage 526 (V1), e.g., DVDD, can be an externally supplied digital power voltage source of 1.8V, voltage 522 (V2), e.g., AVDD, can be an externally supplied analog power voltage source of 2.8V, voltage 529 (V3), e.g., Vhigh, can be an internally generated positive boost voltage from a booster circuit of 3.6V, and voltage 521 (V4), e.g., Vlow can be an internally generated negative boost voltage from a booster circuit of –0.2V. Embodiments are not limited to this example.

In this example, the driver output 525 can initially be at or near a low reference voltage such as ground, or can be brought to a ground voltage by sending the enable input ena_ground to a high logic level while sending logic low levels to enable inputs ena_high, ena_analog, ena_digital, and ena_low as described above in the discussion of FIGS. 3 and 4.

Continuing this example, the drive output can then be brought from the reference voltage 528 (Vref), e.g., ground, to voltage 526 (V1), e.g., DVDD. To apply the supply voltage 526 (V1) to the drive output, the ena_digital input is sent high to apply a logic low level (e.g., a ground potential) to the "digital" control signal line which turns on the PMOS transistor coupled to voltage 526 (V1). As described above, the logic low level on the "digital" control signal line is coupled to one of the PMOS transistors of each of the transistor sets (508-1, 508-2, and 508-4) associated with the ena_high input, the ena_analog input, and the ena_dummy input such that Vhigh is applied to the "high," "analog," and "dummy" control signal lines. The other enable inputs (ena_high, ena_analog, ena_dummy, ena_ground, and ena_low) are all logic level low such that voltage source 526 (V1), e.g., DVDD, is the only available voltage source applied to the driver output 525.

Continuing this example, the drive output can then be brought from voltage 526 (V1), e.g., DVDD, to voltage 522 (V2), e.g., AVDD. To apply the supply voltage 522 (V2) to the drive output, the ena_analog input is sent high to apply a logic low level (e.g., a ground potential) to the "analog" control signal line which turns on the PMOS transistor coupled to voltage source 522 (V2), e.g., AVDD. As described above, the logic low level on the "analog" control signal line is coupled to one of the PMOS transistors of each of the transistor sets (508-1, 508-3, and 508-4) associated with the ena_high input, the ena_digital input, and the ena_dummy input such that Vhigh is applied to the "high," "digital," and "dummy" control signal lines. The other enable inputs (ena_high, ena_digital, ena_dummy, ena_ground, and ena_low) are all logic level low such that voltage 522 (V2), e.g., AVDD, is the only available voltage source applied to the driver output 525.

Continuing this example, the drive output can be then brought from the power supply voltage 522 (V2), e.g., AVDD, to the positive boost voltage 529 (V3), e.g., Vhigh. To apply voltage 529 (V3) to the drive output, the ena_high input is sent high to apply a logic low level to the "high" control signal which turns on the PMOS transistor coupled to voltage source 529 (V3), e.g., Vhigh. The logic low on the "high" control signal line is coupled to one of the PMOS transistors of each of the transistor sets (508-2, 508-3, and 508-4) associated with the ena_analog input, the ena_digital input, and the ena_dummy input such that Vhigh is applied to the "high," "digital," and "dummy" control signal lines. The other enable inputs (ena_analog, ena_digital, ena_dummy, ena_ground, and ena_low) are all logic level low such that voltage 529 (V3), e.g., Vhigh, is the only available voltage source applied to the driver output 525.

In a similar manner, and as discussed in connection with the multilevel driver embodiment of FIG. 4, the enable inputs of the multilevel driver 500 can be operable to successively drive the output 525 from the positive boost voltage level 529 (V3), e.g., Vhigh, to the negative boost level 521 (V4), e.g., Vlow, through an external analog power supply voltage 522 (V2), e.g., AVDD, and/or an external digital power supply voltage 526 (V1), e.g., DVDD, and/or a reference voltage 528 (Vref), e.g., ground. Driving the output of various multilevel driver embodiments in a successive manner may reduce the strain on the driver circuitry and/or booster circuitry by using charge from voltage supplies such as internal and/or externally supplied power voltage supplies that may be less charge sensitive than booster circuits which may be more charge sensitive due to capacitive coupling.

FIG. 5B illustrates the multilevel driver of FIG. 5A including an integrated row decoder 540 according to an embodiment of the present disclosure. The multilevel driver embodiment shown in FIG. 5B includes a row decoder 540 coupled to level shifter 502. In the embodiment of FIG. 5B, the row decoder includes a number of row select lines (RowSel<0> to RowSel<9>) each coupled to the gate of an NMOS transistor. The transistors are series coupled source to drain.

The row decoder 540 can be controlled by timing and control circuitry (e.g., timing and control circuitry 750 as discussed below in FIG. 7) in order to signal the decoder input signal ena_dummy and to turn ON each transistor by the corresponding row select line to apply the driver output signal to the appropriate rowline/wordline of a memory cell and/or pixel array. Integrating the row decoder 540 with the level shifter 502 as illustrated in the embodiment of FIG. 5B can reduce the circuitry associated with selecting a rowline and/or applying a drive output signal to the rowline.

Figure 6:
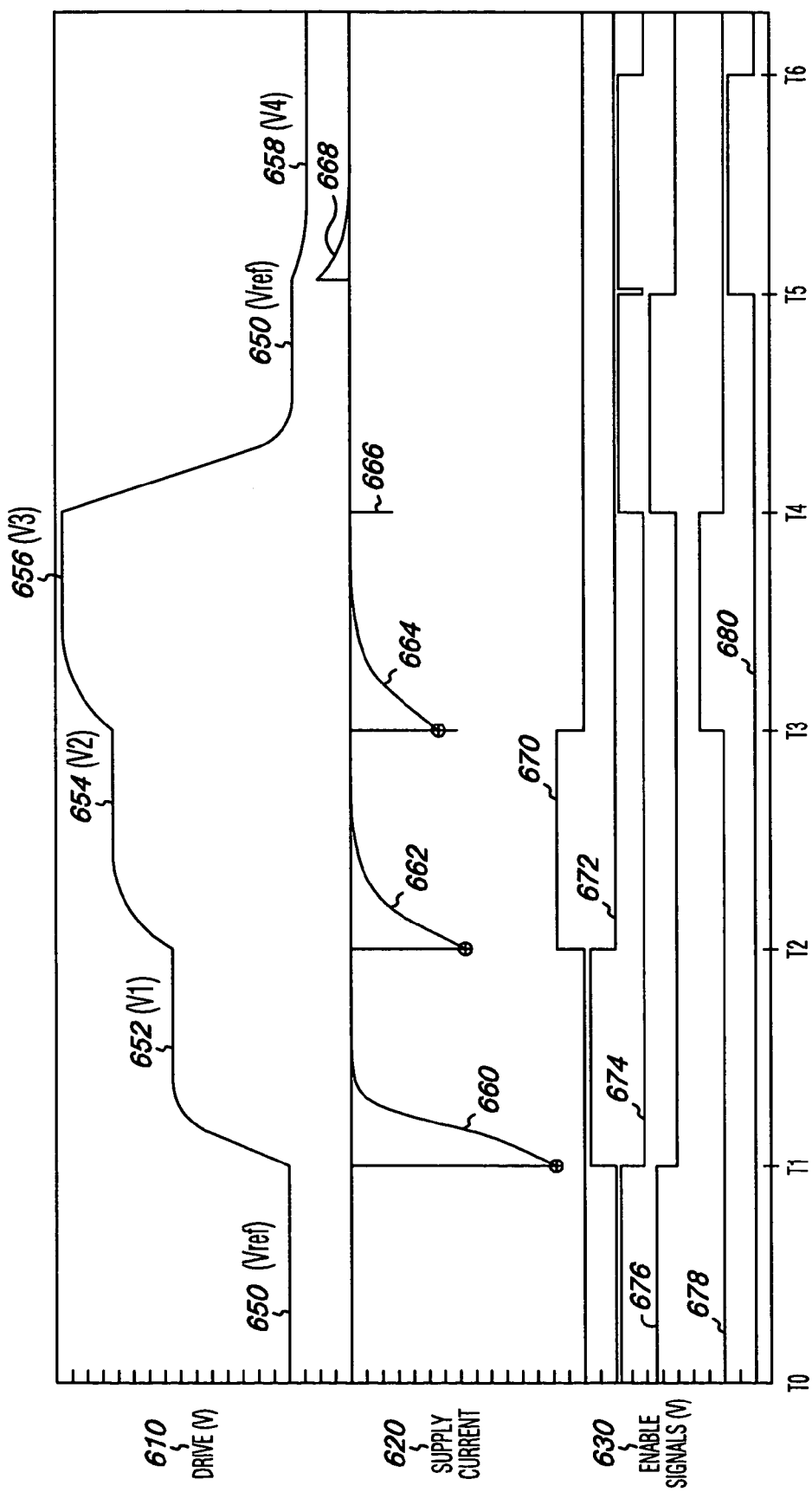
FIG. 6 illustrates a timing chart of various signals according to an embodiment of the present disclosure.

FIG. 6 illustrates a timing chart of various signals according to an embodiment of the present disclosure. The timing chart shown in FIG. 6 illustrates the drive output voltage signal level 610 (DRIVE), the supply current 620 on various power supply voltage sources, and the enable input signal logic levels 630, e.g., high or low at various times during a rising edge and falling edge of the drive output according to various embodiments of the present disclosure. The signals shown in FIG. 6 can represent those associated with a rising edge and falling edge of a drive output signal of a multilevel driver embodiment such as that described in FIGS. 5A and 5B, for example.

In the embodiment shown in FIG. 6, the drive output voltage level 650 can be a reference voltage (e.g., ground), the voltage level 652 can be a first supplied power voltage (e.g., V1 or DVDD), the voltage level 654 can be a second supplied power voltage (e.g., V2 or AVDD), the voltage level 656 can be a first boost voltage (Vhigh or V3), and the voltage level 658 can be a second boost voltage (Vlow or V4).

The timing chart of FIG. 6 shows the drive output signal 610 successively switched from a reference potential 650 (Vref), e.g., ground, to a positive boost voltage level 656 (V3) through two other power supply voltage levels 652 (V1), e.g., DVDD, and 654 (V2), e.g., AVDD, on the rising edge of the output signal. In this embodiment, the drive output signal is then successively switched from the positive boost voltage level 656 (V3) to a negative boost voltage level 658 (V4) through the ground potential 650 (Vref).

In the embodiment shown in FIG. 6, the timing chart includes a number of enable input signals 630, e.g., 670, 672, 674, 676, 678, and 680, which are operable to produce the various drive output signal voltage levels, e.g., 650 (Vref), 652 (V1), 654, (V2), 656 (V3), and 658 (V4). The enable input signals shown in FIG. 6 can correspond to those described in FIG. 5A. For instance, enable input signal 670 can be ena_analog, enable input 672 can be ena_digital, enable input 674 can be ena_dummy, enable input 676 can be ena_ground, enable input 678 can be ena_high, and enable input 680 can be ena_low.

The timing chart shown in FIG. 6 includes supply current signals 620 corresponding to respective supply voltage sources. In this embodiment, current signal 660 corresponds to a first supplied voltage source 652 (V1), e.g., DVDD, current signal 662 corresponds to a second supplied voltage source 554 (V2), e.g., AVDD, current signal 664 corresponds to a positive boost voltage source 656 (V3), current signal 666 corresponds to a reference source 650 (Vref), and current signal 668 corresponds to negative boost voltage source 658 (V4).

As illustrated in FIG. 6, the supply current signals show surges on their respective supply voltage sources when switching. For example, current signal 660 shows a surge at time T1, when the drive output signal 610 switches from the ground potential level 650 to the first supplied voltage source level 652. Similarly, supply current signal 662 shows a surge at time T2, when the drive output signal 610 successively switches to the second supplied voltage source level 654, and the supply current signal 664 shows a surge at time T3, when the drive output signal 610 successively switches to the positive boost voltage level 656. Also, the supply current signal 666 shows a surge at time T4, when the drive output signal 610 successively switches to the ground voltage level 650, and the supply current signal 668 shows a surge at time T5, when the drive output signal 610 successively switches to the negative boost voltage level 658.

Figure 7:
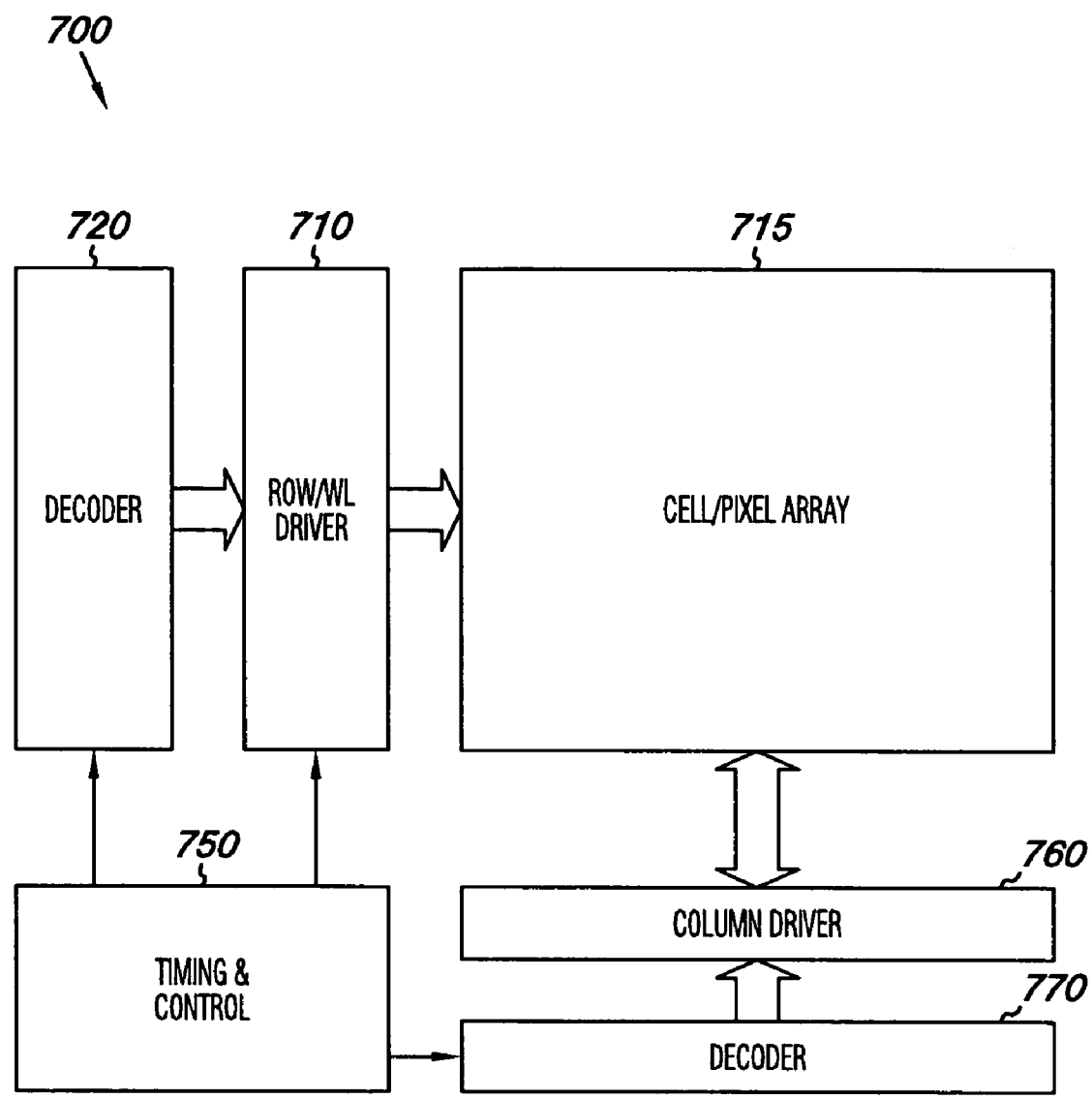
FIG. 7 illustrates a block diagram of a device having a multilevel driver according to an embodiment of the present disclosure.

FIG. 7 illustrates a block diagram of a device 700 having a multilevel driver 710 according to an embodiment of the present disclosure. The device 700 shown in the embodiment of FIG. 7 can be an imager device or memory device having a cell/pixel array 715 including memory cells or pixels as described above in FIGS. 2A-2C, for example.

Array 715 includes a plurality of cells/pixels that can be arranged in a predetermined number of rows and columns (not shown). The cells/pixels of each row are coupled to a rowline/wordline such that each cell/pixel in a row can receive a drive output signal of a rowline/wordline driver 710 in response to row address decoder 720. The cells/pixels of each column are coupled to a columnline and can be selected by column driver 760 in response to column address decoder 770. Hence, each cell/pixel of the array includes a row and column address.

The device 700 can be operated by timing and control circuitry 750, which can control address decoders 720 and 770 for selecting the appropriate rowline and columnline for memory cell and/or pixel cell operations, e.g., reading, programming, writing, or erasing, among various other operations. The timing and control circuitry 750 can also control the rowline/wordline and columnline driver circuitry 710 and 760.

For example, control circuitry 750 can control the rowline/wordline driver enable input signals as described in FIGS. 3-5 in order to successively switch the driver output signal between multiple supply voltage sources. In various embodiments, the switching occurs inside device 700. In such embodiments, not switching between power supply voltage sources outside the device can reduce and/or avoid charge loss upon switching.

Figure 8:
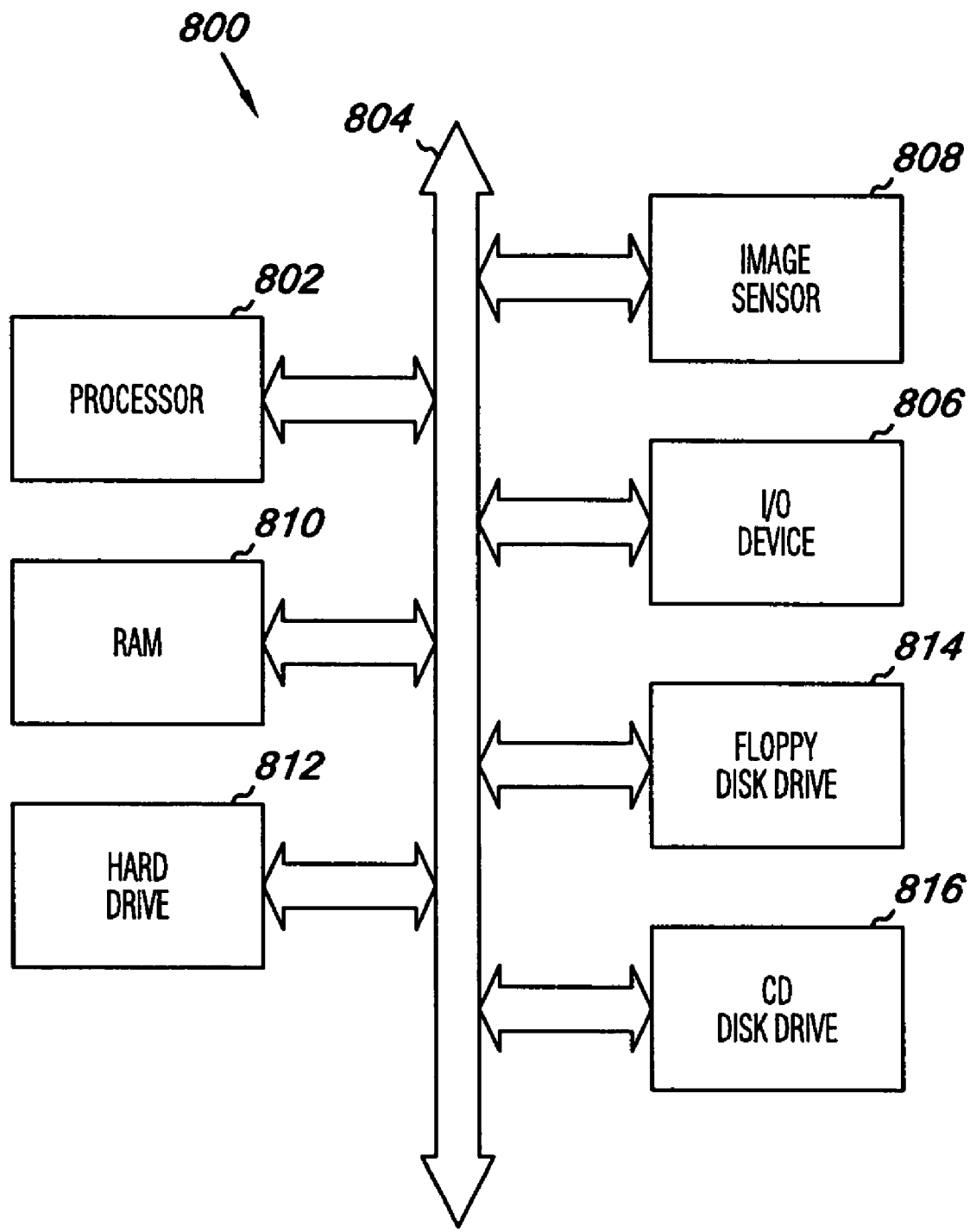
FIG. 8 illustrates a block diagram of an electronic system including at least one device having a multilevel driver according to an embodiment of the present disclosure.

FIG. 8 illustrates a block diagram of an electronic system 800 including at least one device having a multilevel driver according to an embodiment of the present disclosure. As shown in the embodiment of FIG. 8, system 800 includes a processor 802 that communicates with various devices over bus 804. Some of the devices connected to bus 804 provide communication into and out of system 800, illustratively including input/output (I/O) device 806 and image sensor 808. Other devices connected to bus 804 provide memory, illustratively including random access memory (RAM) 810, hard drive 812, and one or more peripheral memory devices such as floppy disk drive 814 and compact disk (CD) drive 816. Various multilevel driver embodiments of the present disclosure can be included as part of the RAM 810 and/or the image sensor 808. That is, the multilevel driver output of various multilevel driver embodiments can be provided to a rowline/wordline of various devices having arrays of pixels and/or memory cells.

Processor based systems exemplify systems of digital circuits that could include an image sensor. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize multilevel driver embodiments of the present disclosure.

CONCLUSION

Method, device, and system embodiments for multilevel rowline/wordline drivers have been described. Rowline/wordline drivers that successively switch the driver output signal between a number of available supply voltage sources on a rising and/or falling edge of the output signal can reduce strain on booster circuits.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for driving a rowline to multiple voltage levels, comprising:
   supplying a first power voltage (V1) to a driver circuit;
   supplying a second power voltage (V2) that is greater than V1 to the driver circuit;
   supplying a first boost voltage (V3) to the driver circuit, V3 being greater than V2; and
   supplying a reference voltage (Vref) that is less than V1 to the driver circuit;
   coupling a level shifter to the driver circuit, the level shifter including a number of input signals configured to control a drive output of the driver circuit; and
   switching the drive output successively from a voltage at or below Vref to at least one of V1, V2, and Vref prior to switching the driving output to V3 when the driving output switches from the voltage at or below Vref to V3.

2. The method of claim 1, wherein switching the drive output successively from the voltage at or below Vref includes successively switching the drive output to V1 and then to V2 and then to V3 when the drive output switches from Vref to V3 on a rising edge of the drive output.

3. The method of claim 1, wherein switching the drive output successively from the voltage at or below Vref includes successively switching the drive output to Vref and then to V1 and then to V2 and then to V3 when the drive output switches from a voltage below Vref to V3.

4. The method of claim 1, wherein supplying the first power voltage includes supplying a first externally supplied voltage and supplying the second power voltage includes supplying a second externally supplied voltage.

5. The method of claim 4, wherein the method includes providing the drive output to a wordline of a memory device.

6. A method for driving a rowline to multiple voltage levels, comprising:
supplying a first power voltage (V1) to a driver circuit;
supplying a second power voltage (V2) that is greater than V1 to the driver circuit;
supplying a first boost voltage (V3) to the driver circuit, V3 being greater than V2;
supplying a reference voltage (Vref) that is less than V1 to the driver circuit; and
supplying a second boost voltage (V4) that is less than Vref to the driver circuit;
providing a level shifter integral to the driver circuit, the level shifter including a number of input signals configured to control a drive output of the driver circuit; and
switching the drive output successively from a voltage at or below Vref to at least one of V1, V2, and Vref prior to switching the driving output to V3 when the driving output switches from the voltage at or below Vref to V3.

7. The method of claim 6, wherein switching the drive output includes switching the drive output successively to V1 and then to V2 and then to V3 when the drive output switches from Vref to V3 on a rising edge of the drive output.

8. The method of claim 6, wherein the method includes switching the drive output successively to at least one of V2, V1, and Vref prior to switching the drive output to V4 when the drive output switches from a voltage greater than Vref to V4 on a falling edge of the drive output.

9. The method of claim 8, wherein switching the drive output to at least one of V2, V1, and Vref includes successively switching the drive output from V3 to V2 to V1 to Vref and to V4 when the drive output switches from V3 to V4.

10. The method of claim 8, wherein the method includes switching the drive output from V3 to Vref and then to V4 when the drive output switches from V3 to V4 on a falling edge of the drive output.

11. A multilevel driver, comprising:
a driver output switchably coupled to a number of voltage sources by a number of transistors, the number of voltage sources including:
a first supplied voltage power source;
a second supplied voltage power source;
a ground potential; and
a first boosted voltage source; and
logic circuitry including a number of enable inputs operable to successively turn on the number of transistors in order to switch the driver output signal to the first supplied voltage source and the first boosted voltage source on a rising edge of the driver output signal.

12. The multilevel driver of claim 11, wherein the first supplied voltage source, the second supplied voltage source, and the first boosted voltage source are positive voltages, the second supplied voltage source being greater than the first supplied voltage source and less than the first boosted voltage source.

13. The multilevel driver of claim 12, wherein the logic circuitry is configured to successively switch the driver output signal to the first supplied voltage source, the second supplied voltage source, and the first boosted voltage source on a rising edge of the driver output signal.

14. The multilevel driver of claim 12, wherein the number of voltage sources includes a second boosted voltage source which is a negative voltage.

15. The multilevel driver of claim 14, wherein the logic circuitry is configured to successively switch the driver output signal from one of the positive voltage sources to ground and to the second boosted voltage source on a falling edge of the driver output signal.

16. The multilevel driver of claim 14, wherein the logic circuitry is configured to successively switch the driver output signal from the first boosted voltage to ground and to the second boosted voltage source on a falling edge of the driver output signal.

17. The multilevel driver of claim 11, wherein the driver output is supplied to at least a portion of a pixel array.

18. A multilevel driver, comprising:
a driver output signal switchably coupled to a first external supply voltage, a second external supply voltage, and a ground potential, wherein the first supply voltage is less than the second supply voltage; and
a level shifter integral to the multilevel driver including a number of enable input signals operable to successively apply the first supply voltage and the second supply voltage to the driver output signal on a rising edge of the output signal.

19. The multilevel driver of claim 18, wherein the driver output signal is coupled to a positive boost voltage and a negative boost voltage, and wherein the level shifter is configured to successively drive the driver output signal to the positive boost voltage through the first supply voltage and the second supply voltage.

20. The multilevel driver of claim 19, wherein the driver output signal is provided to at least a portion of a pixel array.

21. The multilevel driver of claim 18, wherein the driver output signal is coupled to a positive boost voltage and a negative boost voltage, and wherein the level shifter is configured to successively drive the driver output signal from the positive boost voltage to the negative boost voltage through at least one voltage selected from the group including:
the first supply voltage;
the second supply voltage; and
the ground potential.

22. The multilevel driver of claim 18, wherein the first supply voltage and the second supply voltage are externally supplied voltages.

23. The multilevel driver of claim 22, wherein the first supply voltage is a digital supply voltage and the second supply voltage is an analog supply voltage.

24. The multilevel driver of claim 18, wherein the driver output signal is provided to a write rowline of a 3-transistor dynamic random access memory array.

25. The multilevel driver of claim 18, wherein the second supply voltage is about 2.8V and the first supply voltage is about 1.8V.

26. A sensor, comprising:
a pixel array including a number of pixels arranged in rows and columns;
a row driver having a drive output signal coupled to pixels in a row of the array, the row driver including at least four voltage sources including at least one positive boost voltage, each voltage source having a corresponding enable input signal and each voltage source capable of being applied to the drive output by a triggering of the corresponding enable input signal; and
wherein the enable input signals are triggered to successively switch the drive output signal through a number of the at least four voltage sources to the positive boost voltage on a rising edge of the output signal.

27. The sensor of claim 26, wherein the row driver is configured such that the driver output signal maintains its state when the all of the enable input signals are untriggered.

28. The sensor of claim 26, wherein each of the enable input signals are coupled to a cascode structure.

29. The sensor of claim 26, wherein the row driver includes an integrated row decoder.

30. The sensor of claim 26, wherein each of the voltage supplies providing the at least four voltage sources receives a current surge only when the drive output signal is switched to the voltage source provided by the corresponding voltage supply.

31. The sensor of claim 26, wherein each enable input signal is coupled to the gate of an NMOS transistor.

32. The sensor of claim 26, wherein at least two of the at least four voltage sources are external power sources, and wherein the at least one positive boost voltage is supplied by an internal booster circuit.

33. The sensor of claim 26, wherein the at least four voltage sources include:
an external voltage source of about 1.8 V;
an external voltage source of about 2.8 V;
a positive boost voltage of about 3.6 V; and
a ground potential.

34. A memory device, comprising:
a memory array;
a row decoder coupled to the memory array;
a number of multilevel wordline drivers coupled to the memory array and to a number of voltage sources, the number of voltage sources including:
a first supplied power voltage source;
a second supplied power voltage source;
a positive boost voltage generated by a first booster circuit;
a negative boost voltage generated by a second booster circuit; and
a ground potential; and
a number of enable inputs coupled to the number of multilevel drivers, wherein each of the number of voltage sources has a corresponding one of the number of enable inputs, and wherein the number of enable inputs are operable to:
successively switch an output signal of each of the number of multilevel drivers coupled to a wordline of the memory array to the positive boost voltage through the first externally supplied power voltage source and the second externally supplied power voltage source on a rising edge of the output signal; and
successively switch an output signal of each of the number of multilevel drivers coupled to a wordline of the memory array from the positive boost voltage to the negative boost voltage through the ground potential on a falling edge of the output signal.

35. The memory device of claim 34, wherein the first supplied power voltage source and the second supplied power voltage source are externally supplied power voltage sources, and wherein the second voltage source has a voltage greater than the first voltage source.

36. An imaging system, comprising:
a of processor;
an imaging sensor comprising an array of pixels coupled to the processor;
a multilevel row driver having a drive output signal coupled to pixels in a row of the array, wherein the row driver is coupled to a number of voltage sources including:
a first supplied power voltage source;
a second supplied power voltage source;
a positive boost voltage generated by a first booster circuit;
a negative boost voltage generated by a second booster circuit; and
a ground potential; and
a level shifter integral to the multilevel driver including a number of enable inputs, wherein each of the number of voltage sources has a corresponding one of the number of enable inputs, and wherein the number of enable inputs are operable to:
successively switch the drive output signal of the multilevel driver to the positive boost voltage through the first supplied power voltage source and the second supplied power voltage source on a rising edge of the output signal; and
successively switch the output signal of the multilevel driver from the positive boost voltage to the negative boost voltage through the ground potential on a falling edge of the output signal.

37. A method of fabricating a multilevel driver circuit, comprising:
forming a driver portion of the multilevel driver circuit such that a driver output is switchably coupled to a number of supplied voltage sources, the number of supplied voltage sources including:
a first supply voltage (V1);
a second supply voltage (V2) that is greater than the first supply voltage; and
a ground voltage (Vref) that is less than the first supply voltage; and
forming a level shifter portion of the multilevel driver circuit integral to the multilevel driver circuit and coupled to the driver portion by a number of control signal lines to successively switch the driver output from the Vref to the V2 through the V1.

38. The method of claim 37, wherein forming the level shifter portion includes:
forming logic circuitry having a number of enable inputs, including:
a first enable input associated with providing the V1 to the driver output;
a second enable input associated with providing the V2 to the driver output;
a third enable input associated with providing the Vref to the driver output; and
wherein forming the logic circuitry having the number of enable inputs includes forming each enable input to have a corresponding control signal line.

39. The method of claim 37, wherein forming the level shifter includes forming the level shifter such that only one of the control signal lines can be a logic level low at a time.

40. The method of claim 37, wherein the method includes:
forming the driver portion such that the driver output can be switchably coupled to a third (V3) and a fourth (V4) supplied voltage source;
forming the level shifter portion to include a fourth enable input associated with providing the V3 to the driver output; and
forming the driver portion to include a fifth enable input associated with providing the V4 to the driver output.

* * * * *

UNITED STATES PATENT AND TRADEMARK OFFICE
CERTIFICATE OF CORRECTION

| | | |
|---|---|---|
| PATENT NO. | : 7,447,085 B2 | Page 1 of 1 |
| APPLICATION NO. | : 11/504433 | |
| DATED | : November 4, 2008 | |
| INVENTOR(S) | : Boemler | |

It is certified that error appears in the above-identified patent and that said Letters Patent is hereby corrected as shown below:

In column 19, line 57, in Claim 36, delete "a of processor;" and insert -- of a processor; --, therefor.

Signed and Sealed this

Third Day of March, 2009

JOHN DOLL
*Acting Director of the United States Patent and Trademark Office*